(12) United States Patent
Yu et al.

(10) Patent No.: US 8,935,467 B2
(45) Date of Patent: Jan. 13, 2015

(54) MEMORY SYSTEM, AND A METHOD OF CONTROLLING AN OPERATION THEREOF

(71) Applicant: Samsung Electronics Co., Ltd., Gyeonggi-do (KR)

(72) Inventors: Hak Soo Yu, Hwaseong-si (KR); Joo Sun Choi, Hwaseong-si (KR); Hong Sun Hwang, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 155 days.

(21) Appl. No.: 13/676,610

(22) Filed: Nov. 14, 2012

(65) Prior Publication Data

US 2013/0159617 A1 Jun. 20, 2013

(30) Foreign Application Priority Data

Dec. 16, 2011 (KR) .......................... 10-2011-0136365

(51) Int. Cl.
*G06F 13/00* (2006.01)
*G06F 12/00* (2006.01)
*G11C 11/406* (2006.01)
*G06F 13/16* (2006.01)

(52) U.S. Cl.
CPC .............. *G06F 12/00* (2013.01); *G11C 11/406* (2013.01); *G06F 13/16* (2013.01)
USPC ............................. 711/106; 714/723; 365/222

(58) Field of Classification Search
CPC ........... G11C 11/406; G11C 11/40603; G11C 11/40622; G11C 11/401; G11C 7/1006; G11C 29/50; G11C 29/50012; G06F 13/1636
See application file for complete search history.

(56) References Cited

U.S. PATENT DOCUMENTS

| | | | |
|---|---|---|---|
| 5,644,545 A | 7/1997 | Fisch | |
| 7,478,285 B2 | 1/2009 | Fouquet-Lapar | |
| 7,836,374 B2 | 11/2010 | Klein | |
| 7,872,929 B2 | 1/2011 | Dell et al. | |
| 8,171,380 B2* | 5/2012 | Yang et al. | 714/774 |
| 8,386,833 B2* | 2/2013 | Smith et al. | 714/5.1 |
| 2008/0158995 A1* | 7/2008 | Harari et al. | 365/185.22 |
| 2009/0161459 A1* | 6/2009 | Kohler et al. | 365/201 |
| 2012/0269018 A1* | 10/2012 | Shin et al. | 365/200 |
| 2012/0287727 A1* | 11/2012 | Wang | 365/189.05 |
| 2012/0300568 A1* | 11/2012 | Park et al. | 365/222 |

FOREIGN PATENT DOCUMENTS

JP 09-231748 9/1997

* cited by examiner

*Primary Examiner* — April Y Blair
*Assistant Examiner* — Jason Blust
(74) *Attorney, Agent, or Firm* — F. Chau & Associates, LLC (57) ABSTRACT

A memory system that includes a memory device and a memory controller. The memory device includes a plurality of memory cells, and a first storage unit configured to store information about a weak cell from among the plurality of memory cells. The memory controller is configured to transmit an operation command signal to the memory device, and control an operation of the memory device by using the information about the weak cell provided from the first storage unit. If the operation command signal is related to an operation to be performed using a first of the memory cells and the first memory cell is the weak cell, the memory device is configured to transmit the information about the weak cell to the memory controller.

19 Claims, 9 Drawing Sheets

| Group | Weak Cell Address | Information Bit | Retention Time | tWR |
|---|---|---|---|---|
| 1 | C1 | 001 | 32ms | • |
| 2 | C3 | 010 | 16ms | • |
| 3 | C5 | 101 | • | 20ns |
| 4 | C7 | 111 | • | 40ns |

MEMORY SYSTEM, AND A METHOD OF CONTROLLING AN OPERATION THEREOF

CROSS-REFERENCE TO RELATED APPLICATION

This application claims priority under 35 U.S.C. §119(a) to Korean Patent Application No. 10-2011-0136365, filed on Dec. 16, 2011, in the Korean Intellectual Property Office, the disclosure of which is incorporated by reference herein in its entirety.

BACKGROUND

1. Technical Field

One or more exemplary embodiments of the inventive concept relate to a memory system and a method of controlling an operation thereof, and more particularly, to a memory system, the performance of which may be improved, and a method of controlling an operation of the memory system.

2. Discussion of the Related Art

A large capacity dynamic random access memory (DRAM) has found increased use in mobile electronic products, e.g., a smart phone. DRAM stores data in memory cells constituted by capacitors. Since capacitors leak charge, data stored in a memory cell of a DRAM may be changed. To maintain the data stored in the memory cell, a refresh operation is performed in which the capacitor is periodically recharged.

In addition, as DRAM process technology continues to scale down, the capacitance of a memory cell becomes smaller and a refresh cycle becomes shorter. Thus, if a DRAM is manufactured without changing its refresh cycle or a time needed to perform a write operation, the yield of the DRAM decreases.

To secure data stored in a DRAM, a refresh time of memory cells having a short data retention time (e.g., 'weak memory cells') may be used for all of the DRAM's memory cells. In this case, memory cells having a long data retention time (e.g., 'normal memory cells') are refreshed with the refresh time of the weak memory cells. Accordingly, even if most of the memory cells are normal, they are refreshed more often than needed. This results in a large amount of power being consumed to perform a refresh operation such as an auto-refresh operation or a self-refresh operation.

A memory system may be controlled by separately managing weak memory cells. However, it is inefficient to use a memory controller to manage information about these idle cells on which operations, e.g., a read/write operation, are not performed.

SUMMARY

According to an exemplary embodiment of the inventive concept, there is provided a memory system including a memory device including a plurality of memory cells, and a first storage unit configured to store information about a weak cell from among the plurality of memory cells; and a memory controller configured to transmit an operation command signal to the memory device, and control an operation of the memory device by using the information about the weak cell provided from the first storage unit. If the operation command signal is related to an operation to be performed using a first of the memory cells and the first memory cell is the weak cell, the memory device is configured to transmit the information about the weak cell to the memory controller.

The memory system may further include a transmission line that is disposed between the memory device and the memory controller, and the transmission line is configured to transmit the information about the weak cell.

If the first memory cell is the weak cell, the memory device may be configured to change a flag signal, and transmit the information about the weak cell to the memory controller, based on the changed flag signal.

The flag signal may be changed after a predetermined time from a time when the operation command signal is transmitted.

If the first memory cell is the weak cell, the memory controller is configured to perform an RAS only refresh (ROR) to refresh the weak cell, based on a data retention time included in the information about the weak cell received from the memory device.

If the first memory cell is a normal memory cell, the memory controller is configured to perform auto refresh on the normal memory cell.

The first storage unit is configured to store an address of the weak cell, a type of data written to the weak cell, and a data retention time and a write time of the weak cell.

If a plurality of weak cells correspond to a write command received from the memory controller, the memory device is configured to transmit information about a weak cell having a shortest data retention time from among the plurality of weak cells to the memory controller.

If data written to the weak cell having the shortest data retention time has a first logic level, the memory device is configured to transmit the information about the weak cell having the shortest data retention time to the memory controller.

If a plurality of weak cells correspond to a write command received from the memory controller, the memory device is configured to transmit information about a weak cell having a longest write time from among the plurality of weak cells to the memory controller.

If data written to the weak cell having the longest write time has a first logic level, the memory device is configured to transmit the information about the weak cell having the longest write time to the memory controller.

The memory controller may further include a second storage unit configured store the information about the weak cell received from the memory device on a page basis; and a controller configured to control an operation of the memory device, based on the information about the weak cell stored in the second storage unit, wherein the information about the weak cell stored in the second storage unit is updated based on information about a weak cell having a shortest data retention time from among weak cells belonging to the same page.

The memory controller is configured to update the information about the weak cell stored in the second storage unit, based on information about a weak cell having a longest write time from among the weak cells belonging to the same page.

The information about the weak cell stored in the second storage unit may include a data retention time, a write time, an address of the weak cell, and a last read time stamp, and if a time period after the last read time stamp of the weak cells belonging to the same page is greater than a predetermined time period, the memory controller is configured to invalidate information about the weak cells belonging to the same page.

According to an exemplary embodiment of the inventive concept, there is provided a method of controlling an operation of a memory system, the method including storing information about weak cells in a first storage unit of a memory device by testing the memory device which includes a plurality of memory cells; transmitting an operation command signal to the memory device from a memory controller; in response to the operation command signal being received at the memory device and a memory cell corresponding to the operation command signal being one of the weak cells, transmitting information about the weak cell to the memory controller from the memory device; storing information about a weak cell having a shortest data retention time or a longest write time in the memory controller, based on the received information about the weak cells; and controlling a refresh operation, a read operation, or a write operation of the memory device, based on the information stored in the memory controller.

The information about weak memory cells stored in the first storage unit is in the form of a table.

The information stored in the memory controller is in the form of a table.

According to an exemplary embodiment of the inventive concept, there is provided a memory system including a memory device including a memory cell array and a first storage unit including information about weak cells in the memory cell array; and a memory controller, wherein the memory controller is configured to provide a write command and an address of a memory cell to be written to the memory device, the memory device is configured to compare the address of the memory cell to be written with the information about the weak cells in the first storage unit and if the memory cell to be written is a weak cell, the memory device is further configured to provide the information about this weak cell to the memory controller, the memory controller is configured to store the information about the weak cell in a second storage unit and provide a refresh command to the memory device to refresh the weak cell on the basis of the information in the second storage unit.

The refresh command is an RAS only refresh (ROR).

If the memory cell to be written is a normal cell, the memory controller is configured to perform an auto refresh on the normal cell.

BRIEF DESCRIPTION OF THE DRAWINGS

The above and other features of the inventive concept will become more apparent by describing in detail exemplary embodiments thereof with reference to the accompanying drawings in which.

DETAILED DESCRIPTION OF THE EMBODIMENTS

Exemplary embodiments of the inventive concept will be described more fully with reference to the accompanying drawings. This inventive concept may, however, be embodied in many different forms and should not be construed as limited to the exemplary embodiments set forth herein.

Figure 1:
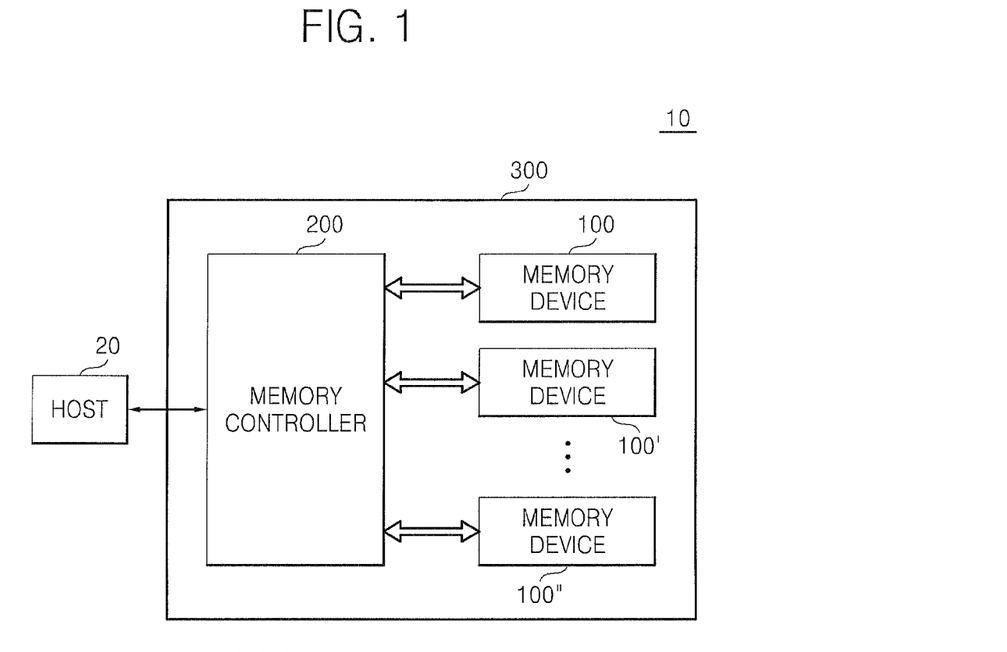
FIG. 1 is a block diagram of an electronic system according to an exemplary embodiment of the inventive concept.

FIG. 1 is a block diagram of an electronic system 10 according to an exemplary embodiment of the inventive concept. The electronic system 10 includes a memory system 300 and a host 20. The memory system 300 may include a memory controller 200, and memory devices 100, 100' ... 100".

The host 20 may communicate with the memory system 300 by using an interface protocol, such as peripheral component interconnect-express (PCI-E), advanced technology attachment (ATA), serial ATA (SATA), parallel ATA (PATA), or serial attached small computer system interface SCSI (SAS). However, examples of an interface protocol for communicating between the host 20 and the memory system 300 are not limited thereto, and may include other interface protocols such as universal serial bus (USB), multi-media card (MMC), enhanced small disk interface (ESDI), and integrated drive electronics (IDE).

The memory controller 200 controls operations of the memory system 300, and controls exchange of data between the host 20 and the memory devices 100, 100' ... 100". For example, the memory controller 200 controls the memory device 100, 100' ... 100" to perform a write/read operation therein, according to a request from the host 20.

In addition, the memory controller 200 controls operations of the memory devices 100, 100' ... 100" by supplying commands for controlling the memory devices 100, 100' ... 100".

Each of the memory devices 100, 100' ... 100" may include a dynamic random access memory (DRAM) and a non-volatile memory. Examples of the non-volatile memory may include electrically erasable programmable read-only memory (EEPROM), flash memory, magnetic RAM (MRAM), spin-transfer torque MRAM (STT-MRAM), ferroelectric RAM (FeRAM), phase change RAM (PRAM), resistive RAM (RRAM), nanotube RRAM, polymer RAM, nano floating gate memory, holographic memory, a molecular electronics memory device, and insulator resistance change memory.

The memory system 300 according to the current exemplary embodiment may be installed in a system, such as a mobile device, a notebook computer, or a desktop computer, but is not limited thereto.

Figure 2:
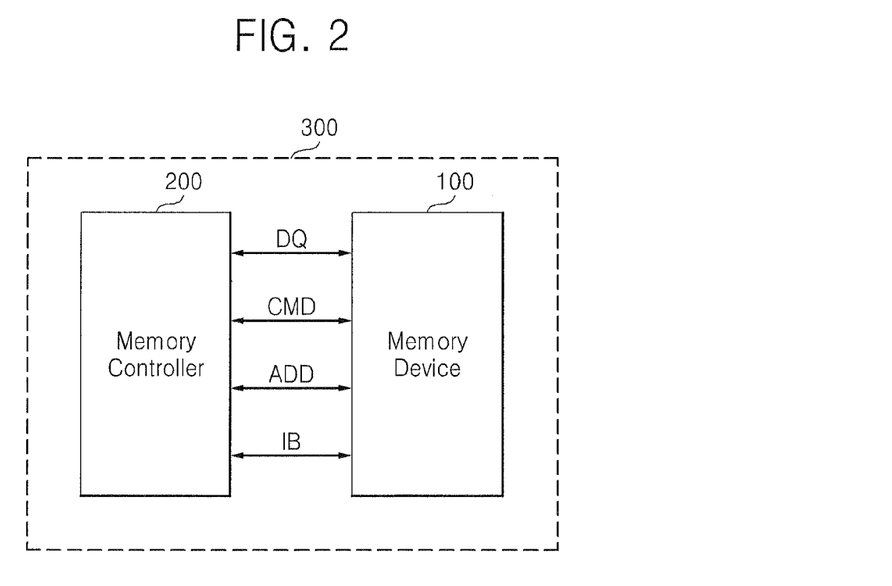
FIG. 2 is a block diagram of a memory system according to an exemplary embodiment of the inventive concept.

FIG. 2 is a block diagram of a memory system 300 according to an exemplary embodiment of the inventive concept. For convenience, the memory system 300 will now be described with respect to a single memory device 100 corresponding to a memory controller 200.

The memory system 300 may include the memory device 100 and the memory controller 200, and may include a data DQ pin, an address ADD pin, a command CMD pin, and an information bit IB pin for connecting the memory device 100 and the memory controller 200.

Referring to FIGS. 1 and 2, the memory controller 200 may supply data to the memory device 100 or receive data from the memory device 100, via the data DQ pin, according to a request from the host 20. In addition, the memory controller 200 may supply an address to the memory device 100 or receive an address from the memory device 100, via the address ADD pin.

In addition, the memory controller 200 may supply a command (e.g., an operation command signal) to the memory device 100 for instructing the memory device 100 to perform an active, write, read, or refresh operation, via the command CMD pin. In addition, the memory controller 200 may receive information about a weak memory cell from among memory cells included in the memory device 100 from the memory device 100, via the information bit IB pin. The information bit IB pin may be installed independently from the data DQ pin, the address ADD pin, and the command CMD pin. If the information bit IB pin is not present, the memory device 100 may transmit the information about the weak cell to the memory controller 200 via at least one pin from among the data DQ pin, the address ADD pin, and the command CMD pin.

The memory controller 200 may continuously supply, to the memory device 100, an address signal ADD together with a command CMD for performing an active operation of the memory device 100, the address signal ADD together with a command CMD for performing a write/read active operation of the memory device 100, and the address signal ADD together with a command CMD for performing a refresh operation of the memory device 100.

Figure 3:
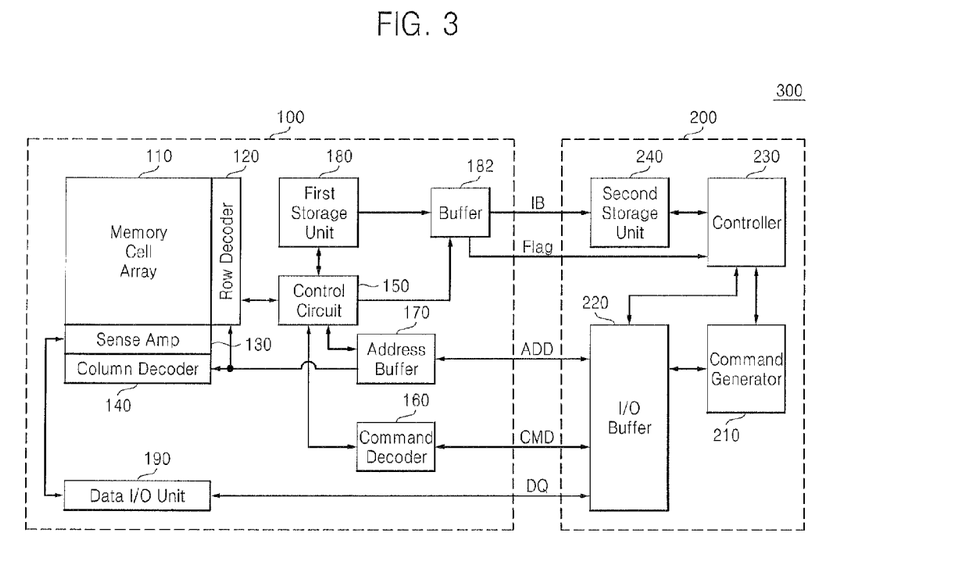
FIG. 3 is a block diagram of a memory system according to an exemplary embodiment of the inventive concept.

FIG. 3 is a block diagram of a memory system 300 according to an exemplary embodiment of the inventive concept. Referring to FIGS. 1 to 3, the memory system 300 includes a memory device 100 and a memory controller 200. The memory device 100 includes a memory cell array 110, a row decoder 120, a sense amplifier 130, a column decoder 140, a control circuit 150, a command decoder 160, an address buffer 170, a first storage unit 180, a buffer 182, and a data input/output (I/O) unit 190. Operations of the memory device 100 are briefly described below.

The memory cell array 110 is a data storage place in which a plurality of memory cells are arranged in row and column directions. The sense amplifier 130 senses and amplifies data stored in the memory cells, and stores data in the memory cells. The memory cell array 110 may include a plurality of memory banks.

Data input via the data I/O unit 190 is written to the memory cell array 110 based on an address signal ADD. Data read from the memory cell array 110 is supplied to the memory controller 200 via the data I/O unit 190, based on the address signal ADD.

To designate a memory cell which data is to be written to or read from, the address signal ADD output from the memory controller 200 is input to the address buffer 170. The address buffer 170 temporarily stores the address signal ADD output from the memory controller 200.

The first storage unit 180 may test the plurality of memory cells included in the memory cell array 110, and store information about a low-performance memory cell, e.g., a weak cell, from among the plurality of memory cells.

For example, if the memory device 100 is a DRAM, then a memory cell that has a short refresh cycle and thus consumes a large amount of power or a memory cell that needs a long write time and thus degrades an operating speed of the memory device 100, may be referred to as a weak cell.

If the memory device 100 is a PRAM, then a memory cell, the data retention time of which becomes shorter since data degradation occurs therein as time goes by, may be referred to as a weak cell.

If the memory device 100 is a flash memory device, the flash memory device may be repeatedly programmed or erased; however, the flash memory device has a limited number of erase/program cycles. In other words, repetitive erase/program cycles may cause stress to be applied to oxide layers of a flash memory transistor and may thus change a threshold voltage of a flash memory cell. Thus, a read margin may be reduced, and a read or write error may occur in a memory cell included in the flash memory device. Such a memory cell may be referred to as a weak cell.

However, the inventive concept is not limited thereto. For example, if the memory device 100 is of a different type from those just mentioned a memory cell that has been degraded by the repeated performance of a write/read operation, may be referred to as a weak cell. In the first storage unit 180, the address of a weak cell that has been tested and information about the weak cell may be stored so that they may be matched with each other, in the form of a table. For example, information about weak cells, which is organized in the form of a table, may be grouped according to characteristics of the weak cells and then stored in the first storage unit 180. The information about weak cells may include the addresses, data retention times, and write times tWR of the weak cells.

The address of a memory cell that is to be accessed may be transmitted to the address buffer 170 from the memory controller 200 via the address ADD pin, and an operation command signal may be transmitted from the memory controller 200 to the command decoder 160 via the command CMD pin. The inventive concept will now be described with respect to a write command signal that is a type of an operation command signal according to an exemplary embodiment of the inventive concept. This is done because a write operation is performed before a read/refresh command signal is supplied.

If the address of a memory cell that is to be accessed is transmitted to the address buffer 170 from the memory controller 200 via the address ADD pin and a write command signal is transmitted to the command decoder 160 via the command CMD pin, then the control circuit 150 of the memory device 100 compares the address of a memory cell corresponding to the write command signal with the address of a weak cell stored in the first storage unit 180. If a result of the comparing reveals that the memory cell corresponding to the write command signal is a weak cell, then the memory device 100 may transmit information about the weak cell stored in the first storage unit 180 to the memory controller 200 via the buffer 182.

The row decoder 120 decodes a row address included in an address signal ADD received from the address buffer 170 to designate a word line connected to a memory cell which data is to be input to or output from.

In other words, in a data write/read mode, the row decoder 120 enables the word line by decoding the row address received from the address buffer 170. In addition, the row decoder 120 allows the word line to be refreshed based on a row address generated by the control circuit 150.

The column decoder 140 decodes a column address included in the address signal ADD received from the address buffer 170 to designate a bit line connected to the memory cell which data is to be input to or output from.

The memory cell array 110 reads data from or writes data to the memory cell designated based on the row and column addresses.

The command decoder 160 receives command signals CMD from the memory controller 200, decodes the command signals CMD, and internally generates a decoded operation command signal, e.g., an active signal, a read signal, a write signal, or a refresh signal.

The control circuit 150 may receive, for example, a refresh command signal decoded by the command decoder 160, and supply an internal row address to the row decoder 120 to refresh a word line of the memory cell array 110.

The control circuit 150 receives a write command signal and the address of a memory cell corresponding to the write command signal from the memory controller 200 via the command decoder 160.

The control circuit 150 compares the address of a weak cell from among the memory cells included in the memory cell array 110 with the address of the memory cell corresponding to the write command signal. This is done by accessing the first storage unit 180. If the memory cell corresponding to the write command signal is a weak cell, the control circuit 150 transmits the address and information bits IB of the weak cell stored in the first storage unit 180 to a second storage unit 240 in the memory controller 200.

In addition, if the memory cell corresponding to the write command signal is a weak cell, the control circuit 150 changes a flag signal. The changed flag signal and information about the weak cell associated with the changed flag signal are respectively transmitted to a controller 230 of the memory controller 200 and the second storage unit 240, via the buffer 182.

The information bits IB stored in the first storage unit 180 may be transmitted via the data DQ pin, the command CMD pin, or the address ADD pin, or may be transmitted via the information bit IB pin installed separately from the data DQ pin, the command CMD pin, and the address ADD pin.

In addition, the flag signal output from the control circuit 150 may be transmitted via an additional pin, or may be transmitted via the data DQ pin, the command CMD pin, or the address ADD pin.

Although not shown in FIG. 3, the memory device 100 may further include a clock circuit that generates a clock signal, and a power supply circuit that receives a power supply voltage from the outside and either generates an internal voltage from the power supply voltage or divides the power supply voltage.

The memory controller 200 according to the current exemplary embodiment may include a command generator 210, an I/O buffer 220, the controller 230, and the second storage unit 240.

The command generator 210 generates an operation command signal for allowing the memory device 100 to perform an active operation, a read operation, a write operation, or a refresh operation, under control of the controller 230

The controller 230 receives information about a page including a weak cell from the second storage unit 240. The controller 230 may analyze this information, and control the memory device 100 to perform the read, write, or refresh operation, depending on whether a target cell is a weak cell or a normal cell. The command generator 210 may generate an operation command signal based on this analysis, under control of the controller 230.

The I/O buffer 220 may temporarily store signals to be transmitted to or received from the memory device 100. The memory device 100 is connected to the I/O buffer 220 via the data DQ pin, the command CMD pin, and the address ADD pin. In addition, data, an address, or an operation command signal output from the memory controller 200 may be transmitted to the memory device 100 via the I/O buffer 220.

The second storage unit 240 may store a data retention time and a write time tWR of a weak cell, the address of a page including the weak cell, and information about a time when a read operation was most recently performed on this page, in the form of a table.

In this case, if a time period that occurs after a last read operation is performed on weak cells belonging to the same page is greater than a predetermined time period, then the memory controller 200 may invalidate information about the weak cells belonging to the same page. This is because when a time period, which occurs after a last read operation is performed on a memory cell belonging to a page, is greater than the predetermined time period and no further read operation is performed on the memory cell, the page including this memory cell may be determined as including unnecessary data. Thus, the memory controller 200 may control the size of the table stored in the second storage unit 240 so that that table does not overflow. A shape of the table and a method of controlling the table so that the table does not overflow are described in detail with reference to FIG. 8 below.

Figure 4A:
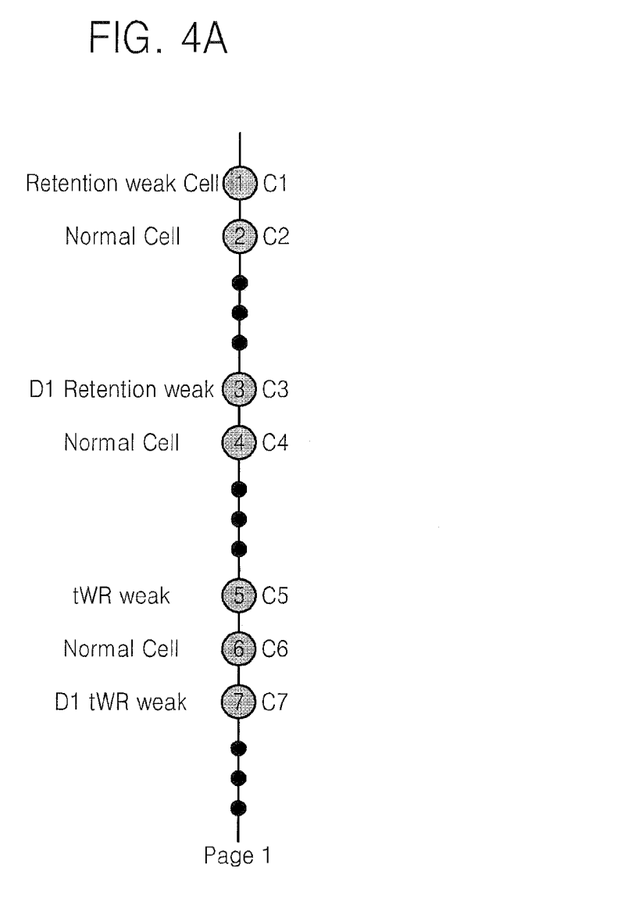
FIG. 4A illustrates memory cells of a memory device, according to an exemplary embodiment of the inventive concept.
Figure 4B:
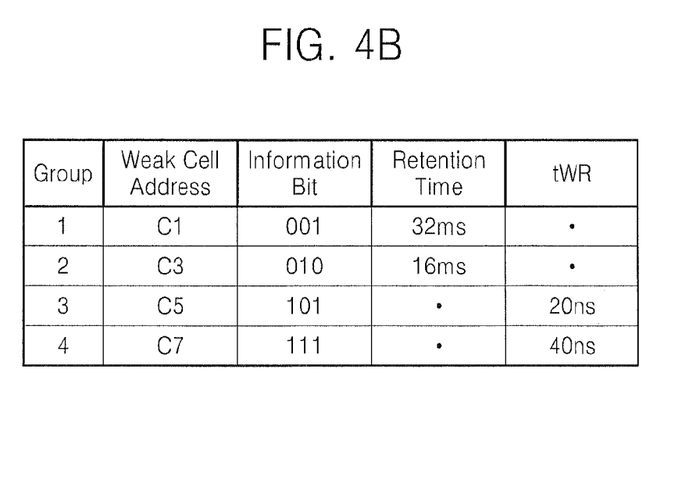
FIG. 4B is a table showing information about weak cells from among the memory cells of FIG. 4A, according to an exemplary embodiment of the inventive concept.

FIG. 4A illustrates memory cells of a memory device according to an exemplary embodiment of the inventive concept. FIG. 4B is a table showing information about weak cells from among the memory cells of FIG. 4A, according to an exemplary embodiment of the inventive concept.

Referring to FIGS. 3 to 4B, the memory cell array 110 may include a plurality of memory cells, and the plurality of memory cell may form one page together. Referring to FIG. 4A, a page 1 includes a plurality of memory cells, and memory cells having addresses C1 to C7 from among the plurality of memory cells receive a write command from the memory controller 200.

The memory cell having the address C1 is a weak cell, the data retention time of which is shorter than that of a normal cell. The memory cell having the address C3 is a weak cell, the data retention time of which is shorter than that of a normal cell when the memory cell having the address C3 has data '1' (logic high). The memory cell having the address C5 is a weak cell, the write time of which is longer than that of a normal cell. The memory cell having the address C7 is a weak cell, the write time of which is longer than that of a normal cell when the memory cell having the address C7 has data '1' (logic high). The memory cells having the addresses C2, C4, and C6 are normal cells.

Weak cells may have different characteristic. For example, if the weak cell having the address C1 has a data retention time of 32 ms and the weak cell having the address C3 has a data retention time of 16 ms, then weak cells having a data retention time of 32 ms may be classified into one group and weak cells having a data retention time of 16 ms may be classified into another group.

If the weak cell having the address C5 has a write time of 20 ns and the weak cell having the address C7 has a write time of 40 ns, weak cells having a write time of 20 ns may be classified into one group and weak cells having a write time of 40 ns may be classified into another group.

Referring to FIG. 4B, a group 1 includes weak cells having the address C1, and a data retention time of the memory cells belonging to the group 1 is 32 ms. A group 2 includes weak cells having the address C3, and a data retention time of the memory cells belonging to the group 2 is 16 ms. A group 3 includes the weak cells having the address C5, and a write time of the memory cells belonging to the group 3 is 20 ns. A group 4 includes the weak cells having the address C7, and a write time of the memory cells belonging to the group 4 is 40 ns.

The first storage unit 180 may store information about weak cells in the form of a table, based on a data retention time or a write time tWR.

Referring to FIG. 4B, information bits (IBs) are classified into, for example, four groups. If groups are divided by two criteria, each of the four groups may consist of three bits. In this case, the information bits (IBs) may consist of a first bit and two other bits. The first bit represents a characteristic of a weak cell.

For example, if the first bit is '0,' then it may mean that the data retention time of the weak cell is longer than that of a normal cell. If the first bit is '1,' then it may mean that a write time of the weak cell is longer than that of a normal cell.

The other two bits denote information about a data retention time when the first bit is '0,' and denote information about a write time when the first bit is '1.' For example, first bit '0' of information bits '001' and '010' denotes data retention times, and the other two bits '01' and '10' denote that the data retention times are 32 ms and 16 ms, respectively.

Figure 5A:
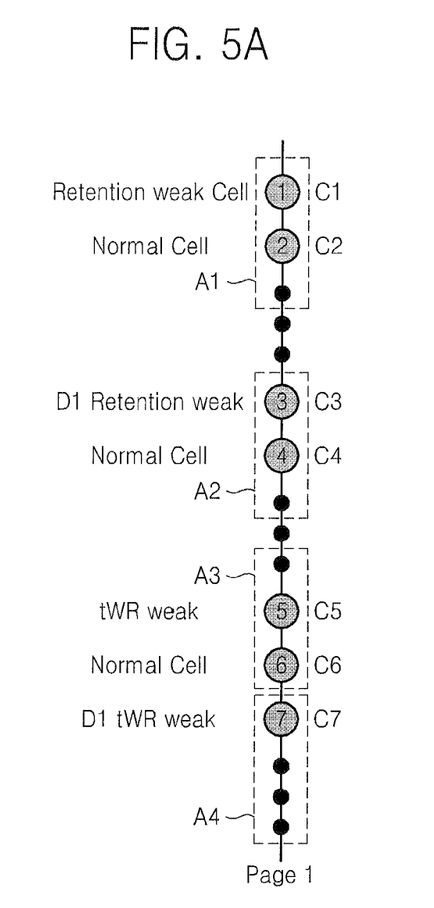
FIG. 5A illustrates memory cells of a memory device, according to an exemplary embodiment of the inventive concept.
Figure 5B:
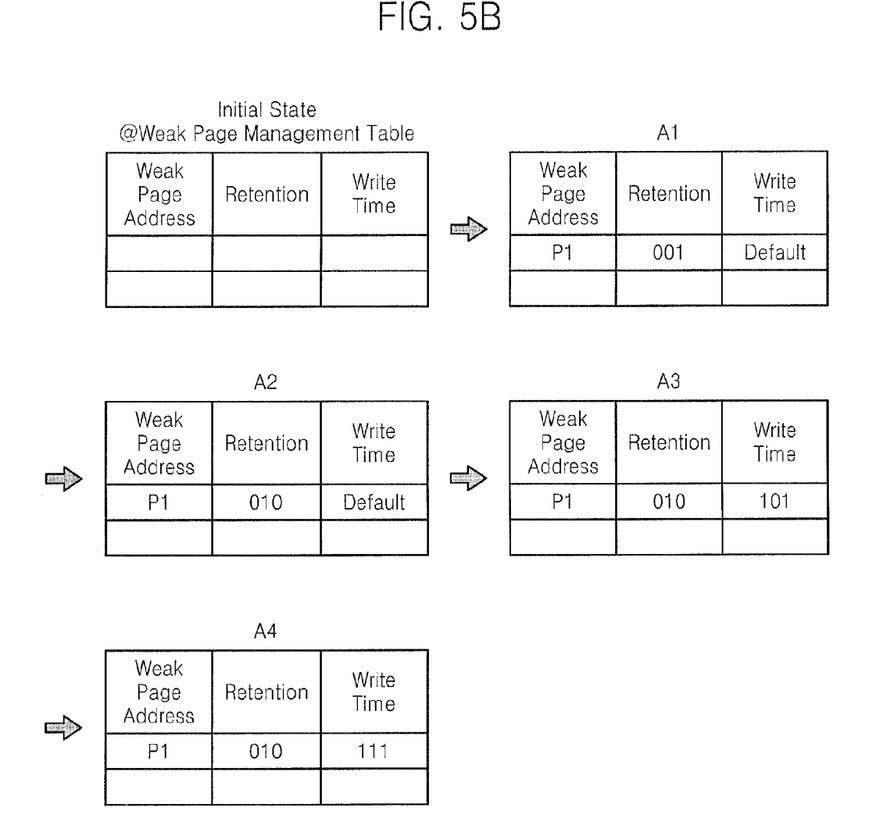
FIG. 5B is a table showing information about weak cells stored in a memory controller, according to an exemplary embodiment of the inventive concept.

FIG. 5A illustrates memory cells of the memory device 100 of FIG. 3, according to an exemplary embodiment of the inventive concept. FIG. 5B is a table showing information about weak cells stored in the memory controller 200 of FIG. 3, according to an exemplary embodiment of the inventive concept.

Referring to FIGS. 3 to 5B, the memory cell array 110 may include a plurality of memory cells, and the plurality of memory cells may form one page together, similar to as illustrated in FIG. 4A. Referring to FIG. 5A, a page 1 includes a plurality of memory cells, and memory cells having addresses C1 to C7 from among the plurality of memory cells receive a write command from the memory controller 200.

The memory cell having the address C1 is a weak cell, the data retention time of which is shorter than that of a normal cell. The memory cell having the address C3 is a weak cell, the data retention time of which is shorter than that of a normal cell when the memory cell having the address C3 has data '1' (logic high). The memory cell having the address C5 is a weak cell, the write time of which is longer than that of a normal cell. The memory cell having the address C7 is a weak cell, the write time of which is longer than that of a normal cell when the memory cell having the address C7 has data '1' (logic high). The memory cells having the addresses C2, C4, and C6 are normal cells.

In FIG. 5A, 'A1' to 'A4' denote regions that are temporarily set so that a change in information about weak cells stored in the second storage unit 240 of the memory controller 200 may be shown according to types of weak cells included in the regions A1 to A4, during writing of data to the plurality of memory cells.

FIG. 5B illustrates a change in information recorded in a weak page management table stored in the second storage unit 240. In an initial state, no information is recorded in the weak page management table.

Then, the memory controller 200 transmits a write command signal to the region A1 including the weak cell having the address C1 from among cells included in the page 1. The weak cell having the address C1 has a shorter data retention time than that of a normal cell and the memory device 100 thus transmits information about the data retention time to the memory controller 200.

Information about the weak cell having the address C1 is stored by using information bits (IBs) as described above with reference to FIG. 4B. The memory device 100 transmits the information bits (IBs) to the memory controller 200. The second storage unit 240 may store the information bits (IBs) received from the memory device 100, in the form of a table.

As writing is continuously performed on the page 1, a memory cell having a shorter data retention time or a memory cell having a longer write time may occur. Thus, information about weak cells included in the page 1 may be updated as writing is continuously performed on the page 1.

In other words, the memory controller 200 may update information about weak cells stored in the second storage unit 240, based on a weak cell having a longest write time from among weak cells belonging to the same page. In addition, the memory controller 200 may update the information about weak cells stored in the second storage unit 240, based on a weak cell having a shortest data retention time from among the weak cells belonging to the same page.

An example of this process is illustrated in FIGS. 5A and 5B.

Referring to FIGS. 3, 5A, and 5B, the memory controller 200 transmits the write command signal to the region A2 including the weak cell having the address C3 from among the memory cells included in the page 1. The weak cell having the address C3 has a shorter data retention time than that of a normal cell, and has a shorter data retention time than the weak cell having the address C1 when the weak cell having the address C3 has data '1' (logic high). For a refresh operation related to a data retention time, a refresh cycle may be set based on a memory cell having a shortest refresh cycle. Thus, the information about the weak cells stored in the second storage unit 240 related to the page 1 may be changed to information about the weak cell having the address C3. Referring to FIG. 5B, the data retention time has '010.'

In addition, the memory controller 200 transmits the write command signal to the region A3 including the weak cell having the address C5 from among the memory cells included in the page 1. The weak cell having the address C5 has a longer write time than that of a normal cell. Thus, the memory device 100 transmits information about the weak cell having the address C5 to the memory controller 200. Referring to FIG. 5B, the write time is changed from a default value to '101.'

Then, the memory controller 200 transmits the write command signal to the region A4 including the weak cell having the address C7 from among the memory cells included in the page 1. The weak cell having the address C7 has a longer write time than that of a normal cell, and has a longer write time than that of the weak cell having the address C5 when the weak cell having the address C7 has data '1' (logic high). To perform a write operation based on a write time, the write time may be set based on a memory cell having a longest write time. Thus, the information about weak cells stored in the second storage unit 240 related to the page 1 may be changed to information about the weak cell having the address C7. Referring to FIG. 5B, the write time may be updated to be '111.'

However, the weak cell having the address C5 and the weak cell having the address C7 are not related to a data retention time, and thus, information about data retention times of these weak cells is not changed.

Although FIGS. 5A and 5B illustrate transmission of the information about the weak cells included in one page, information about weak cells may be transmitted in units of pages in substantially the same way. The inventive concept is not limited to the order in which the regions illustrated in FIG. 5A are arranged, and further the order of transmitting the write command signal to the memory cells included in the regions A1 to A4 is not limited.

In addition, the number of information bits (IBs) is not limited, and may vary according to the number of characteristics used to distinguish the difference between normal cells and weak cells. Further, the bit value that classifies each of the characteristics may vary.

In addition, one page may be divided into several sub pages, and information about weak cells may be stored and updated in units of the sub pages. In this case, information about weak cells stored in the second storage unit 240 in the form of a table may be stored in units of the sub pages.

Figure 6:
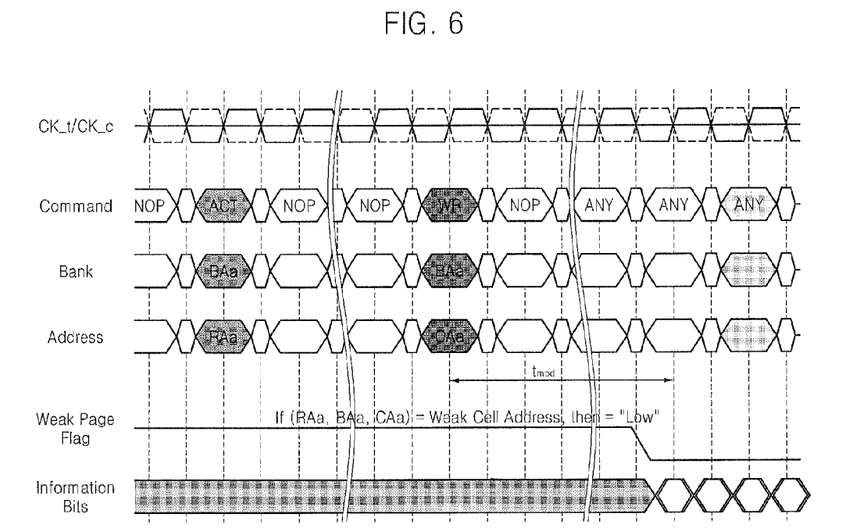
FIG. 6 is a timing diagram illustrating operations of a memory device and a memory controller, according to an exemplary embodiment of the inventive concept.

FIG. 6 is a timing diagram illustrating operations of the memory device 100 and the memory controller 200 of FIG. 3, according to an exemplary embodiment of the inventive concept.

The memory controller 200 outputs an active signal ACT, and sets a bank address BAa and a row address RAa of a memory cell.

After setting the bank address BAa and the row address RAa of the memory cell, the memory controller 200 outputs a write command signal WR. In this case, the memory controller 200 sets a column address CAa of the memory cell.

When the write command signal WR is output and both the column address CAa and row address RAa of the memory cell to which data is to be written are determined, the memory controller 200 transmits the write command signal WR and the column address CAa and row address RAa of the memory cell to which data is to be written, to the memory device 100.

Then, the memory device 100 determines whether the memory cell corresponding to the write command signal WR received from the memory controller 200 is a weak cell. To this end, the memory device 100 may compare the address of the corresponding memory cell RAa, BAa and CAa with addresses of weak cells stored in the first storage unit 180 of FIG. 3.

If the corresponding memory cell is a weak cell, then the memory device 100 may transmit information about the weak cell to the memory controller 200.

In detail, if the corresponding memory cell is a weak cell, the control circuit 150 of FIG. 3 changes a flag signal from logic high to logic low. If the flag signal is changed to logic low, the first storage unit 180 may transmit information bits (IBs) stored therein to the second storage unit 240 of the memory controller 200. In addition, the control circuit 150 may check the information bits (IBs) stored in the second storage unit 240 by transmitting the changed flag signal to the controller 230 of FIG. 3.

In this case, the control circuit 150 may change the flag signal to logic low after a predetermined time period $t_{mpd}$ from a point of time when the memory controller 200 transmits the write command signal. Thus, the information bits (IBs) stored in the first storage unit 180 may be transmitted to the memory controller 200 after the predetermined time period $t_{mpd}$ from the point of time when the memory controller 200 transmits the write command signal.

Figure 7:
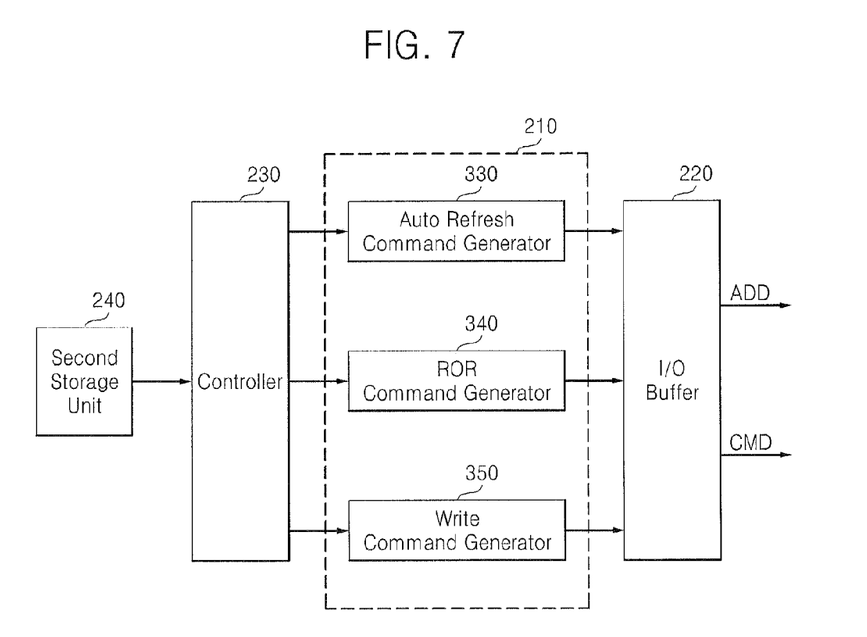
FIG. 7 is a block diagram of a part of a memory controller according to an exemplary embodiment of the inventive concept.

FIG. 7 is a block diagram of a part of a memory controller 200 according to an exemplary embodiment of the inventive concept.

As described above, the memory controller 200 may include a command generator 210, an I/O buffer 220, a controller 230, and a second storage unit 240.

The command generator 210 may include an auto refresh command generator 330, an RAS-only refresh (ROR) command generator 340, and a write command generator 350.

During a refresh operation, if information transmitted to the controller 230 from the second storage unit 240 is information about a page including a weak cell, then the controller 230 controls the ROR command generator 340 to generate an ROR command signal. The ROR command signal is transmitted to the memory device 100 of FIG. 3 via the I/O buffer 220.

If the information transmitted to the controller 230 from the second storage unit 240 is not information about a page including a weak cell, then the controller 230 controls the auto refresh command generator 330 to generate an auto refresh command signal. The auto refresh command signal is transmitted to the memory device 100 via the I/O buffer 220.

Only a refresh command signal is transmitted to the memory device 100 in an auto refresh mode, whereas both the ROR command signal and the address of a memory cell that is to be refreshed are transmitted in an ROR mode. In other words, when a weak cell is to be refreshed, the memory controller 200 transmits the ROR command signal and the address of the weak cell to the memory device 100 to perform an ROR. When a normal cell is to be refreshed, the memory controller 200 transmits the auto refresh command signal to the memory device 100 to perform an auto refresh.

The ROR command generator 340 may receive information about a data retention time of a weak cell that is to be refreshed from the second storage unit 240, and perform an ROR based on the received information.

When receiving information about a page including a weak cell via the second storage unit 240, the write command generator 350 generates a write command signal.

Figure 8:
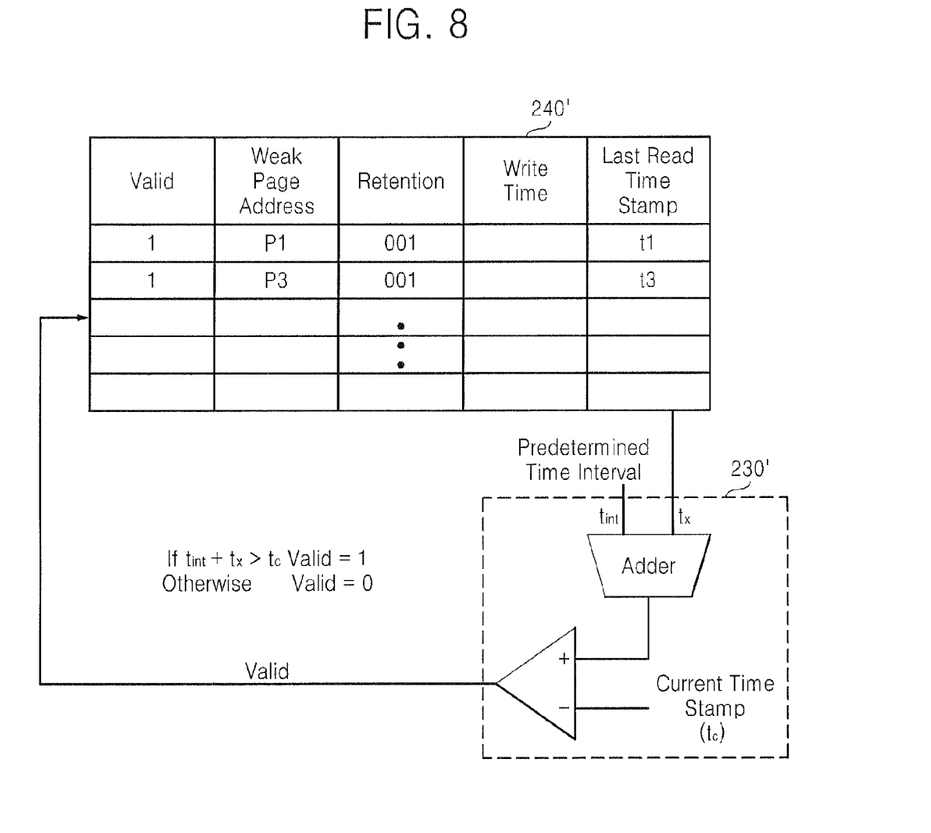
FIG. 8 is a table stored in a second storage unit of a memory controller, according to an exemplary embodiment of the inventive concept.

FIG. 8 is a table 240' stored in the second storage unit 240 of the memory controller 200 of FIG. 3, according to an exemplary embodiment of the inventive concept.

The second storage unit 240 stores information about weak cells included in pages, in units of pages, in the form of a table. Examples of information about a weak cell may include a data retention time, a write time, and so on. In addition, the second storage unit 240 may store a last read time stamp of weak cells forming each of pages.

The last read time stamp may be a point of time when a read command signal was most recently received from the memory controller 200 with respect to the weak cells forming each of the pages. If the point of time when the read command signal was most recently received from the memory controller 200 is close to a current point of time, desired data is highly likely to be written to a target page. On the other hand, if the point of time when the read command signal was most recently received from the memory controller 200 is later than a predetermined time period, undesired data is highly likely to be written to a memory cell forming the target page.

Thus, if a certain time has elapsed after the last read time stamp, it is possible to predetermine a time interval $t_{int}$ based on whether data written to a memory cell forming a target page is undesired.

A controller 230' may add the predetermined time interval $t_{int}$ to a last read time stamp $t_x$ of one of the pages stored in the table 240', and compare a result of the adding with a current time stamp $t_c$. If the sum of the predetermined time interval $t_{int}$ and the last read time stamp $t_x$ is greater than the current time stamp $t_c$, then the controller 230' may directly store information about weak cells belonging to the page in the second storage unit 240.

If the sum of the predetermined time interval $t_{int}$ and the last read time stamp $t_x$ is less than the current time stamp $t_c$, then the controller 230' may invalidate the page. Thus, the controller 230' may delete the information about the weak cells belonging to the page. Otherwise, the controller 230' may overwrite information about weak cells belonging to another page in the table 240' by storing the information about the weak cells belonging to the page.

Figure 9:
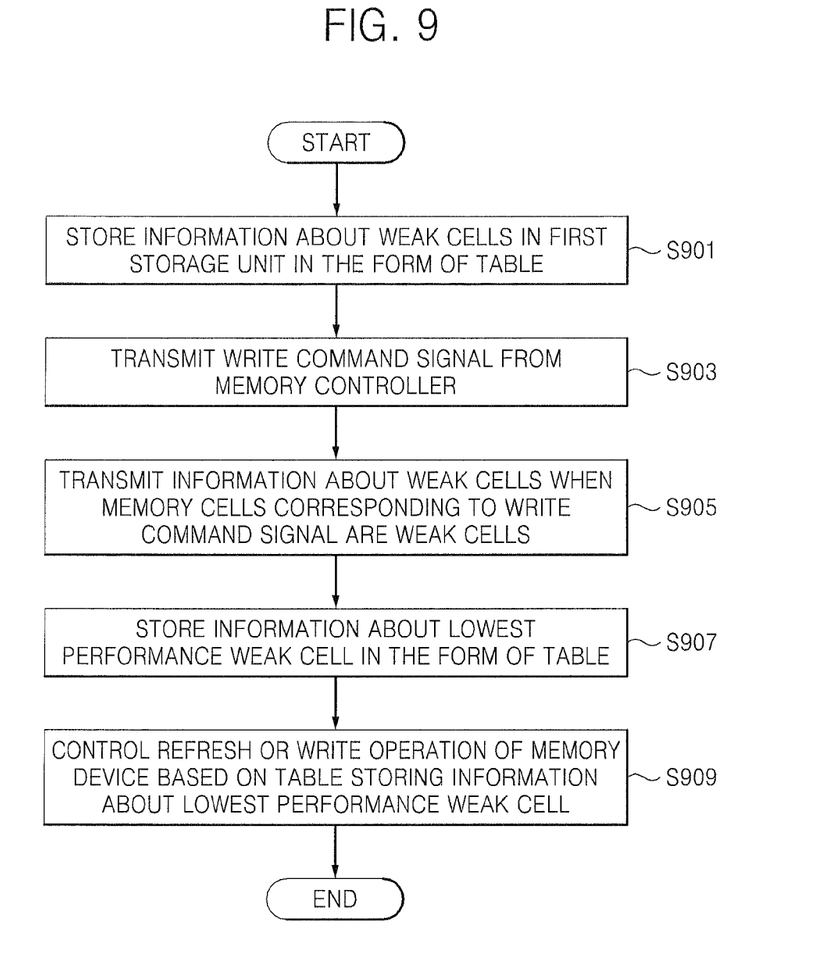
FIG. 9 is a flowchart illustrating a method of controlling an operation of a memory system, according to an exemplary embodiment of the inventive concept.

FIG. 9 is a flowchart illustrating a method of controlling an operation of a memory system, according to an exemplary embodiment of the inventive concept. Referring to FIGS. 3 and 9, information about weak cells is stored in the first storage unit 180 in the form of a table by testing a data retention time or a write time of the memory device 100 including a plurality of memory cells (operation S901). The memory controller 200 generates a write command signal and transmits the write command signal to the memory device 100 (operation S903). If memory cells corresponding to the write command signal are weak cells, the memory device 100 transmits information about the weak cells to the memory controller 200 (operation S905). The second storage unit 240 may store information about a weak cell having a shortest data retention time or a longest write time tWR in the form of a table, based on the information about the weak cells received from the memory device 100 (operation S907). The memory controller 200 may control a refresh operation or a write operation of the memory device 100, based on the information in the table stored in the second storage unit 240 (operation S909).

A memory device or a memory system according to an exemplary embodiment of the inventive concept may be installed in an electronic system. An example of such an electronic system is illustrated in FIG. 10.

Figure 10:
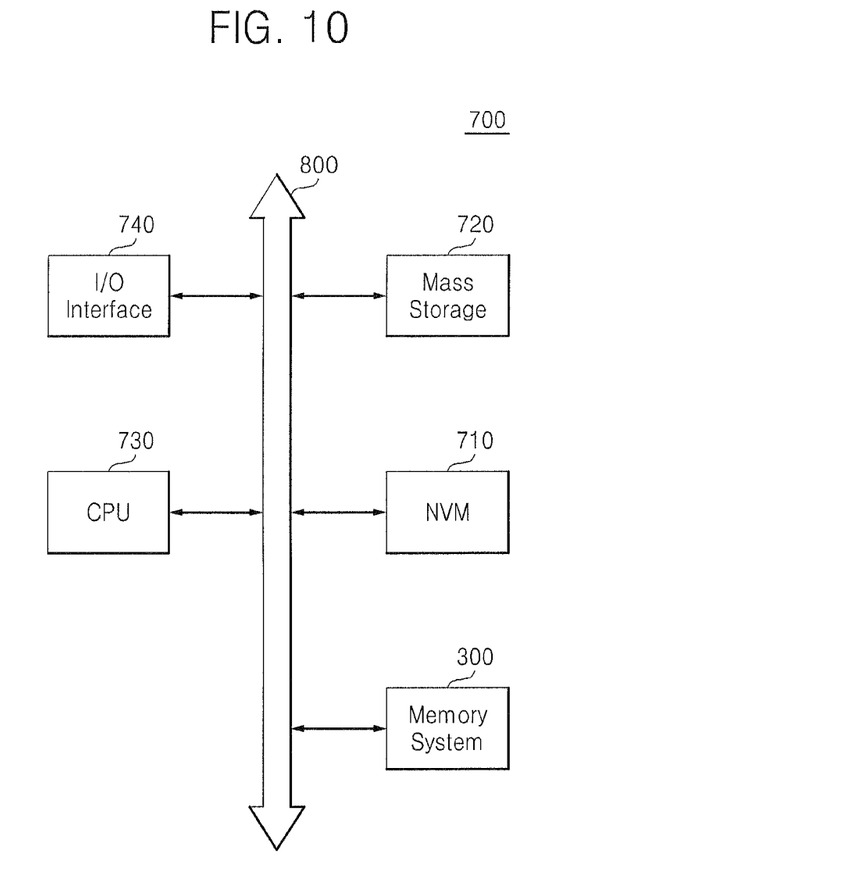
FIG. 10 is a block diagram of an electronic system according to an exemplary embodiment of the inventive concept.

FIG. 10 is a block diagram of an electronic system 700 according to an exemplary embodiment of the inventive concept. Referring to FIGS. 3 and 10, the electronic system 700 may include the memory system 300, a non-volatile memory (NVM) 710, a mass storage device 720, a central processing unit (CPU) 730, and an I/O interface 740. These components may be connected via a bus 800.

The NVM 710 may be flash memory, PRAM, or MRAM. The mass storage device 720 may be a solid state drive (SSD), a hard disc drive (HDD), or a network-attached storage (NAS). The NVM 710 or the mass storage device 720 may store files of an operating system (OS) and other applications.

In addition, the mass storage unit 720 may receive and store a table stored in the second storage unit 240 from the memory controller 200 via the bus 800. If the memory device 100 accesses the electronic system 700, the mass storage device 720 may transmit the table stored therein to the memory controller 200. Thus, the memory controller 200 may check information about memory cells constituting the memory device 100, based on the table received from the mass storage device 720. However, the memory controller 200 may only store information about weak cells corresponding to a write command, from among the memory cells of the memory device 100. Thus, to run a same program or application by using the memory system 300, it is possible to receive the information about the weak cells from the mass storage device 720 and then control the memory device 100 based on the information about the weak cells.

The I/O interface 740 may be connected to a network port for accessing a network or directly connected to the network.

While the electronic system 700 operates, the CPU 730 may control the memory system 300, and thus, the memory device 100 may refresh word lines according to refresh characteristic information corresponding to the memory device 100.

The types of particular components of the electronic system 700 are not limited. For example, the CPU 730 may be one of various types of CPUs, and the memory device 100 may be any of various types of memories, e.g., DRAM or another type of memory that needs to be refreshed. Components of the electronic system 700 according to an exemplary embodiment of the inventive concept are not limited to the devices illustrated in FIG. 10, and the electronic system 700 may further include additional devices.

According to an exemplary embodiment of the inventive concept, when a write operation is performed on a weak memory cell, the weak memory cell is operated based on information about the weak memory cell sent to a memory controller. Thus, it is possible to manage the weak memory cell independently from a normal memory cell while saving information storage space. Accordingly, a refresh operation and a write operation may be efficiently performed.

In the case of a DRAM, information to be transmitted from a memory cell when data of logic 'low' is stored and information to be transmitted from the memory cell when data of logic 'high' is stored may be set to be different from each other, thereby efficiently controlling a refresh cycle.

Furthermore, it is possible to efficiently perform data management by deleting data when a read operation is not performed for a predetermined time or longer.

While the inventive concept has been particularly shown and described with reference to exemplary embodiments thereof, it will be understood by those of ordinary skill in the art that various changes in form and detail may be made thereto without departing from the spirit and scope of the inventive concept as defined by the following claims.

What is claimed is:

1. A memory system, comprising:
a memory device including a plurality of memory cells, and a first storage unit configured to store information about a weak cell from among the plurality of memory cells; and
a memory controller configured to transmit an operation command signal to the memory device, and control an operation of the memory device by using the information about the weak cell provided from the first storage unit,
wherein, if the operation command signal is related to an operation to be performed using a first of the memory cells and the first memory cell is the weak cell, the memory device is configured to transmit the information about the weak cell to the memory controller,
wherein, if the first memory cell is the weak cell, the memory device is configured to change a flag signal, and transmit the information about the weak cell to the memory controller, based on the changed flag signal.

2. The memory system of claim 1, further comprising a transmission line disposed between the memory device and the memory controller, the transmission line configured to transmit the information about the weak cell.

3. The memory system of claim 1, wherein the flag signal is changed after a predetermined time from a time when the operation command signal is transmitted.

4. The memory system of claim 1, wherein, if the first memory cell is the weak cell, the memory controller is configured to perform an RAS only refresh (ROR) to refresh the weak cell, based on a data retention time included in the information about the weak cell received from the memory device.

5. The memory system of claim 1, wherein, if the first memory cell is a normal memory cell, the memory controller is configured to perform auto refresh on the normal memory cell.

6. The memory system of claim 1, wherein the first storage unit is configured to store an address of the weak cell, a type of data written to the weak cell, and a data retention time and a write time of the weak cell.

7. The memory system of claim 1, wherein, if a plurality of weak cells correspond to a write command received from the memory controller, the memory device is configured to transmit information about a weak cell having a shortest data retention time from among the plurality of weak cells to the memory controller.

8. The memory system of claim 7, wherein, if data written to the weak cell having the shortest data retention time has a first logic level, the memory device is configured to transmit the information about the weak cell having the shortest data retention time to the memory controller.

9. The memory system of claim 1, wherein, if a plurality of weak cells correspond to a write command received from the memory controller, the memory device is configured to transmit information about a weak cell having a longest write time from among the plurality of weak cells to the memory controller.

10. The memory system of claim 9, wherein, if data written to the weak cell having the longest write time has a first logic level, the memory device is configured to transmit the information about the weak cell having the longest write time to the memory controller.

11. The memory system of claim 1, wherein the memory controller comprises:
a second storage unit configured store the information about the weak cell received from the memory device on a page basis; and
a controller configured to control an operation of the memory device, based on the information about the weak cell stored in the second storage unit, wherein the information about the weak cell stored in the second storage unit is updated based on information about a weak cell having a shortest data retention time from among weak cells belonging to the same page.

12. The memory system of claim 11, wherein the memory controller is configured to update the information about the weak cell stored in the second storage unit, based on information about a weak cell having a longest write time from among the weak cells belonging to the same page.

13. The memory system of claim 11, wherein the information about the weak cell stored in the second storage unit comprises a data retention time, a write time, an address of the weak cell, and a last read time stamp, and if a time period after the last read time stamp of the weak cells belonging to the same page is greater than a predetermined time period, the memory controller is configured to invalidate information about the weak cells belonging to the same page.

14. A method of controlling an operation of a memory system, the method comprising:
storing information about weak cells in a first storage unit of a memory device by testing the memory device which includes a plurality of memory cells;
transmitting an operation command signal to the memory device from a memory controller;
in response to the operation command signal being received at the memory device and a memory cell corresponding to the operation command signal being one of the weak cells, transmitting information about the weak cell to the memory controller from the memory device;
storing information about a weak cell having a shortest data retention time or a longest write time in the memory controller, based on the received information about the weak cell; and
controlling a refresh operation, a read operation, or a write operation of the memory device, based on the information stored in the memory controller.

15. The method of claim 14, wherein the information, about weak memory cells stored in the first storage unit is in the form of a table.

16. The method of claim 14, wherein the information stored in the memory controller is in the form of a table.

17. A memory system, comprising:
a memory device including a memory cell array and a first storage unit including information about weak cells in the memory cell array; and
a memory controller,
wherein the memory controller is configured to provide a write command and an address of a memory cell to be written to the memory device,
the memory device is configured to compare the address of the memory cell to be written with the information about the weak cells in the first storage unit and if the memory cell to be written is a weak cell, the memory device is further configured to provide the information about this weak cell to the memory controller,
the memory controller is configured to store the information about the weak cell in a second storage unit and provide a refresh command to the memory device to refresh the weak cell on the basis of the information in the second storage unit.

18. The memory system of claim 17, wherein the refresh command is an RAS only refresh (ROR).

19. The memory system of claim 17, wherein if the memory cell to be written is a normal cell, the memory controller is configured to perform an auto refresh on the normal cell.

* * * * *